US008421732B2

(12) United States Patent
Feng

(10) Patent No.: US 8,421,732 B2
(45) Date of Patent: Apr. 16, 2013

(54) IMAGE DISPLAY SYSTEM

(75) Inventor: Yu-Hsiung Feng, Kaohsiung (TW)

(73) Assignee: Chimei Innolux Corporation, Chu-nan, Miao-Li County (TW)

( * ) Notice: Subject to any disclaimer, the term of this patent is extended or adjusted under 35 U.S.C. 154(b) by 1058 days.

(21) Appl. No.: 12/409,983

(22) Filed: Mar. 24, 2009

(65) Prior Publication Data

US 2009/0243991 A1 Oct. 1, 2009

(30) Foreign Application Priority Data

Mar. 25, 2008 (TW) .............................. 97110531 A

(51) Int. Cl.
*G09G 3/36* (2006.01)
*G09G 5/00* (2006.01)
*G11C 19/00* (2006.01)
*H04N 11/20* (2006.01)

(52) U.S. Cl.
USPC ................ 345/99; 345/100; 345/3.2; 377/73; 377/81; 348/448

(58) Field of Classification Search .................. 345/3.2, 345/99, 100; 377/73, 81; 348/448
See application file for complete search history.

(56) References Cited

U.S. PATENT DOCUMENTS 5,272,729 A * 12/1993 Bechade et al. .............. 375/371
7,053,943 B2 5/2006 Kakumoto et al.
7,064,573 B2 * 6/2006 Fujita ......................... 324/750.3

FOREIGN PATENT DOCUMENTS

CN 1486428 A 3/2004

* cited by examiner

*Primary Examiner* — Bipin Shalwala
*Assistant Examiner* — Ilana Spar
(74) *Attorney, Agent, or Firm* — Birch, Stewart, Kolasch & Birch, LLP

(57) ABSTRACT

A system for displaying images includes a display device. The display device includes a timing control circuit, a display matrix, a horizontal driving circuit and a horizontal signal processing circuit. The timing control circuit generates a plurality of timing signals. The display matrix includes a plurality of display elements arranged in a matrix, wherein the display elements are vertically divided into N banks to be updated sequentially. The horizontal driving circuit is coupled to the timing control circuit for generating a plurality of switch signals according to the timing signals and sequentially turning on the banks. The horizontal signal processing circuit is coupled to the timing control circuit, the horizontal driving circuit and the display matrix for determining a turning-on period for each bank according to the timing signals and the switch signals.

9 Claims, 8 Drawing Sheets

IMAGE DISPLAY SYSTEM

CROSS REFERENCE TO RELATED APPLICATIONS

This Application claims priority of Taiwan Patent Application No. 097110531, filed on Mar. 25, 2008, the entirety of which is incorporated by reference herein.

BACKGROUND OF THE INVENTION

1. Field of the Invention

The invention relates to image display systems and more particularly to an image display system for improving image mura defects.

2. Description of the Related Art

High definition, low power consumption, low voltage requirements and light in weight, are all characteristics that have made liquid crystal displays (LCDs) a leading display device technology. LCDs have been broadly applicable for various applications, such as personal digital assistants (PDAs), portable computers, mobile phones, etc.

Generally, driving circuits may be integrated into LCDs to reduce costs and decrease layout area of integrated circuits. For example, driving circuits may be formed on a glass substrate of one display panel by using low temperature polycrystalline silicon thin film transistors (LTPS-TFTs). Such an LCD comprises a vertical driving circuit and a horizontal driving circuit. The former is used to select a row of display elements that are arranged in a display matrix, and the later is used to write display information into the selected row of display elements.

Moreover, the display matrix is divided into a plurality of banks. Accordingly, banks are sequentially updated by a plurality of data signals so as to decrease the data signal requirements. Conventionally, a switch is utilized to control turning-on for each bank. When a specific bank is turned on, the data signals are activated to update the specific bank. Upon the completion of updating the specific bank, the data signals further update a next bank. Therefore, it is necessary to precisely control the turning-on of each bank to avoid data for updating a current bank from being affected by those for a next bank, without inducing image mura defects.

For example, a display matrix is divided into a plurality of banks BANK_1, BANK_2, BANK_3 . . . and BANK_N, wherein each bank is controlled by switch signals S1, S2, S3 . . . and SN. FIG. 1 is a waveform diagram illustrating the overlapping of switch signals S1 and S2 for banks BANK_1 and BANK_2. As shown in FIG. 1, the switch signals S1 and S2 are overlapped. In this embodiment, when the bank BANK_1 is updated by the corresponding switch signal S1, the switch signal S2 also activates the process for updating the bank BANK_2. Therefore, the data signals for updating the bank BANK_1 are affected by the data signals controlled by the switch signal S2. The greater the overlapping of the switch signals S1 and S2, the higher the intersection level as shown in FIG. 1. As a result, the bank BANK_1 is significantly affected by the data signals for the bank BANK_2.

FIG. 2 is a display screen representation showing a display screen with different levels of overlapping switch signals. As described above, a switch signal for turning on each bank is usually generated with other corresponding signals, such as a horizontal timing signal, etc. However, due to component mismatch, temperature, or other factors, delays from the switch signals or other corresponding signals are inconsistently induced. Moreover, overlapping between the generated switch signals is not uniform and a bank problem appears in the display screen as shown in FIG. 2. As a result, the aforementioned mura phenomenon occurs and thereby deteriorates the image quality on the display screen.

BRIEF SUMMARY OF THE INVENTION

Therefore, the invention provides an image display system for effectively avoiding bank problems caused by the overlapping of switch signals.

A system for displaying images includes a display device. The display device includes a timing control circuit, a display matrix, a horizontal driving circuit and a horizontal signal processing circuit. The timing control circuit generates a plurality of timing signals. The display matrix includes a plurality of display elements arranged in a matrix, wherein the display elements are vertically divided into N banks to be updated sequentially. The horizontal driving circuit is coupled to the timing control circuit for generating a plurality of switch signals according to the timing signals and sequentially turning on the banks. The horizontal signal processing circuit is coupled to the timing control circuit, the horizontal driving circuit and the display matrix for determining a turning-on period for each bank according to the timing signals and the switch signals.

Further, an image display system having a display device is provided. The display device comprises a timing control circuit, a display matrix, a timing signal adjusting circuit and a horizontal driving circuit. The timing control circuit generates a plurality of timing signals. The display matrix comprises a plurality of display elements arranged in a matrix and vertically divided into N banks to be updated sequentially. The timing signal adjusting circuit is coupled to the timing control circuit for adjusting the duty cycle of the timing signal. The horizontal driving circuit is coupled to the timing signal adjusting circuit for generating a plurality of switch signals according to the adjusted timing signals to sequentially turn on the banks.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
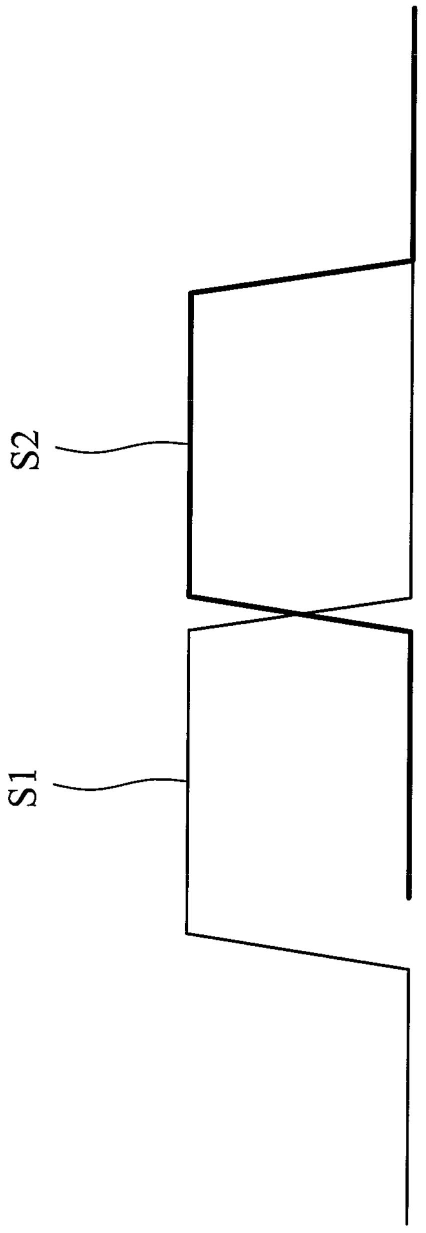
FIG. 1 is a waveform diagram illustrating the overlapping of switch signals for banks according to the prior art.
Figure 2:
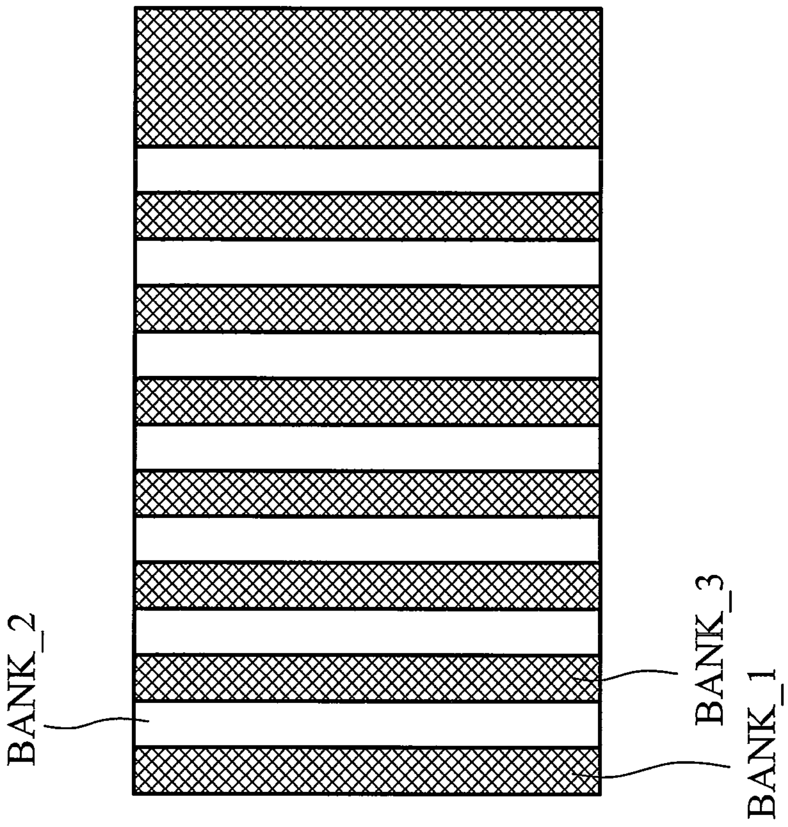
FIG. 2 is a display screen representation showing a display screen with different levels of overlapping switch signals according to the prior art.
Figure 3:
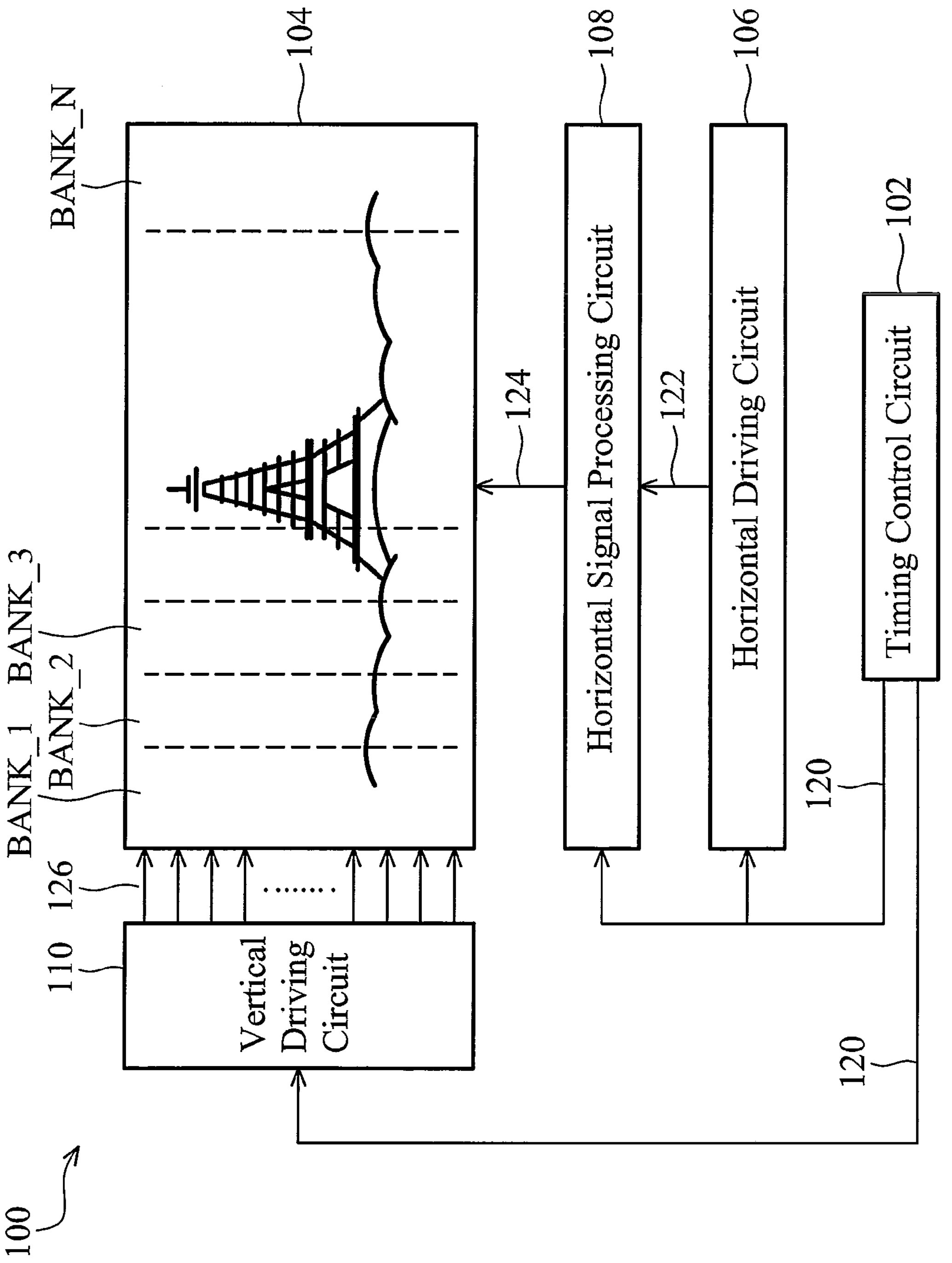
FIG. 3 illustrates a block diagram of an image display system according to one embodiment of the invention.

FIG. 3 illustrates a block diagram of an image display system according to one embodiment of the invention. The image display system comprises a display device 100, which comprises a timing control circuit 102, a display matrix 104, a horizontal driving circuit 106 and a horizontal signal processing circuit 108. The timing control circuit 102 generates a plurality of timing signals 120. The display matrix 104 comprises a plurality of display elements, such as liquid crystal display elements, arranged in a matrix (not shown) and vertically divided into N banks to be updated sequentially. In an embodiment, the display device 100 comprises 24 data signals for updating the display matrix 104. It is assumed that each row comprises 960 display elements, and then the display is accordingly divided into 40 banks (i.e. N is equal to 40), such as banks BANK_1, BANK_2, BANK_3, . . . and BANK_N shown in FIG. 3. Each bank has the same number of display elements. The horizontal driving circuit 106 is further coupled to the timing control circuit 102 for generating a plurality of switch signals 122 according to the timing signals 120, so as to sequentially turn on the banks and update the display elements. The horizontal processing circuit 108 is coupled to the timing control circuit 102, the horizontal driving circuit 106 and the display matrix 104 for determining a turning-on period for each bank according to the timing signals 120 and the switch signals 122, as will be described below in more detail with reference to FIG. 5.

According to one embodiment, the display device 100 further comprises a vertical driving circuit 110 having a plurality of vertical scanning signals 126 for vertically scanning the display matrix 104 to turn on the display elements.

Figure 4:
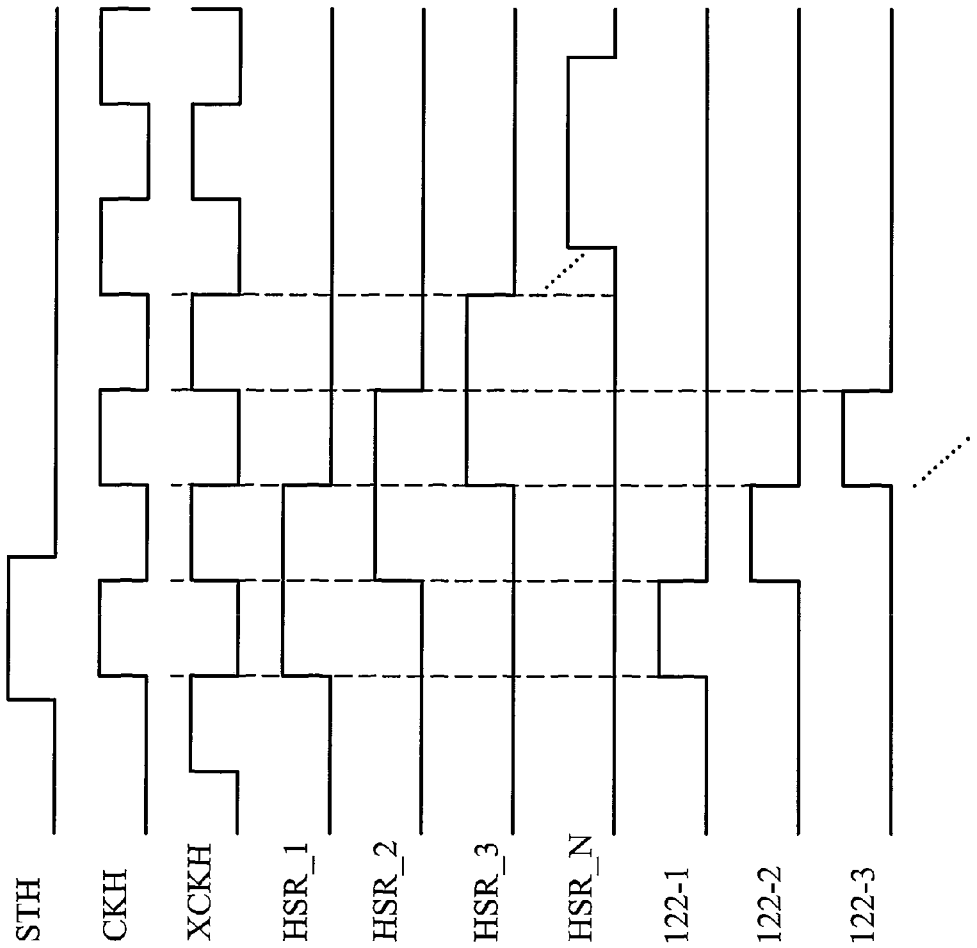
FIG. 4 illustrates a timing diagram of the horizontal driving circuit shown in FIG. 3.

FIG. 4 illustrates a timing diagram of the horizontal driving circuit 106 shown in FIG. 3. In one embodiment, the timing control circuit 102 provides the timing signals 120, which include a horizontal start signal STH, a horizontal timing signal CKH and a complementary horizontal timing signal XCKH. According to FIG. 4, the horizontal driving circuit 106 generates a plurality of control signals HSR_1~HSR_N responsive to the horizontal start signal STH having a high voltage level. For example, when the horizontal start signal STH reaches the high voltage level and the horizontal timing signal CKH is driven to the high voltage level, the horizontal driving circuit 106 generates the signal HSR_1. After a cycle period of the horizontal timing signal has passed, that is, as the horizontal timing signal CKH is again driven to the high voltage level, the horizontal driving circuit 106 subsequently generates the signal HSR_3, and so forth. Similarly, when the horizontal start signal STH reaches the high voltage level and the complementary horizontal timing signal XCKH is driven to the high voltage level, the horizontal driving circuit 106 generates the signal HSR_2. After a cycle period of the complementary horizontal timing signal has passed, i.e. when the complementary horizontal timing signal XCKH is again driven to the high voltage level, the horizontal driving circuit 106 subsequently generates a next signal HSR_4 (not shown), and so forth.

In addition, the horizontal driving circuit 106 generates the switch signals 122 according to the horizontal timing signal CKH, the complementary horizontal timing signal XCKH and the control signals HSR_1, HSR_2, HSR_3, . . . and HSR_N. As shown in FIG. 4, the switch signals are provided for respectively turning on each bank, such as 122-1, 122-2, 122-3, . . . etc. In this embodiment, the switch signals 122-1, 122-2, 122-3, . . . etc. are respectively correspond to the banks BANK_1, BANK_2, BANK_3, . . . etc. in FIG. 3.

Figure 5:
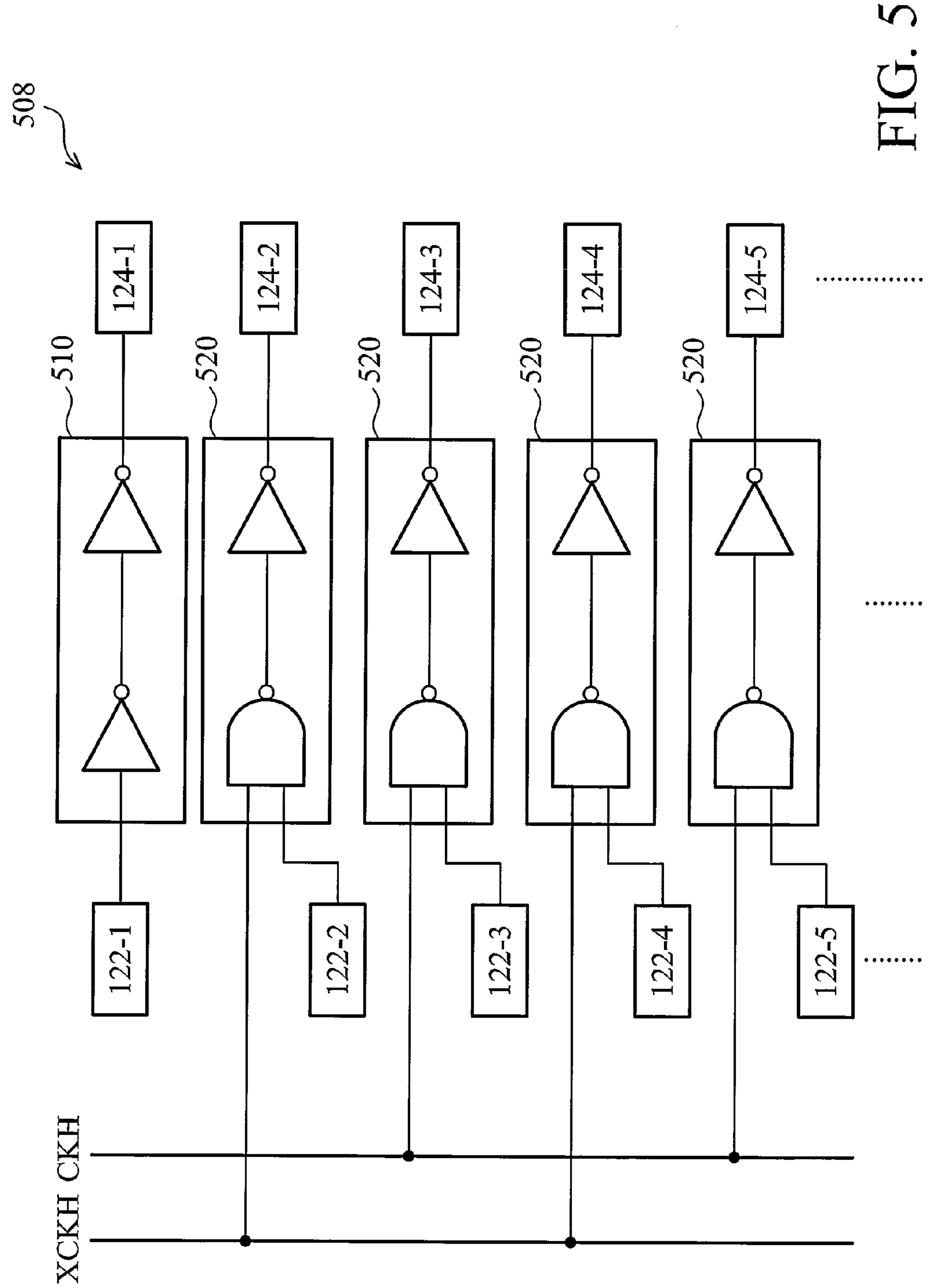
FIG. 5 illustrates a block diagram of a horizontal signal processing circuit in accordance with the invention.

FIG. 5 illustrates a block diagram of a horizontal signal processing circuit 508 in accordance with the invention. According to this embodiment, the horizontal signal processing circuit 508 comprises a first logic circuit 510 and a plurality of second logic circuits 520. The first logic circuit 510 comprises two inverters connected in serial for receiving the switch signal 122-1 corresponding to the first bank (BANK_1 shown in FIG. 3) and generating a first adjusting signal 124-1, so as to determine a turning-on period for the first bank.

Additionally, each of the second logic circuits 520 comprises a NAND gate and an inverter for receiving the switch signals 122-2~122-N corresponding to banks from the second bank to the $N_{th}$ bank (BANK_2~BANK_N shown in FIG. 3). Meanwhile, each of the second logic circuits 520 also receives the horizontal timing signal CKH or the complementary horizontal timing signal XCKH for generating a plurality of second adjusting signals 124-2~124-N, so as to sequentially turn on other banks BANK_2~BANK_N in FIG. 3, respectively. Specifically, according to this embodiment, the horizontal signal processing circuit 508 is able to generate non-overlapping switch signals 124-1~124-N for substantially preventing overlapping of the switch signals or reducing the amount the switch signals 124-1~124-N that overlap, thereby improving image quality for the display.

Figure 6:
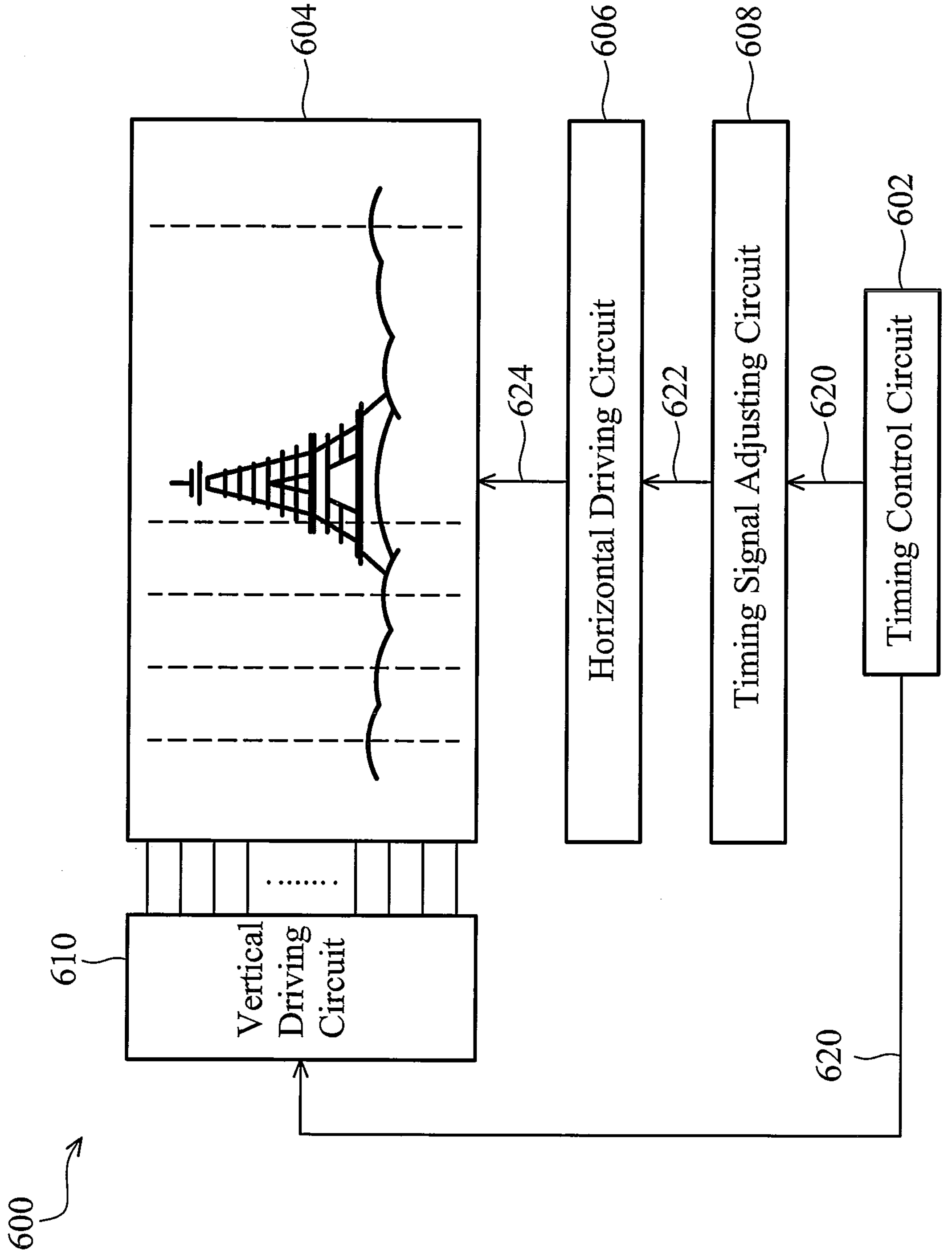
FIG. 6 illustrates a block diagram of an image display system according to another embodiment of the invention.

FIG. 6 illustrates a block diagram of an image display system according to another embodiment of the invention. The image display system comprises a display device 600, which comprises a timing control circuit 602, a display matrix 604, a timing signal adjusting circuit 608, a horizontal driving circuit 606 and a vertical driving circuit 610. Referring to FIG. 6, structures and operations of the timing control circuit 602, the display matrix 604, the horizontal driving circuit 606, and the vertical driving circuit 610 are similar to those of FIG. 3, and hence, further description thereof is omitted for brevity. The difference between FIG. 6 from FIG. 3 resides in that a plurality of timing signals 620, such as the horizontal timing signal CKH and the complementary horizontal timing signal XCKH, are transmitted to the timing signal adjusting circuit 608 after being generated from the timing control circuit 602. The timing signal adjusting circuit 608 adjusts the duty cycle of the timing signals 620 to generate a set of updated signals 622 with an updated horizontal timing signal CKH' and an updated complementary horizontal timing signal XCKH'. The horizontal driving circuit 606 further generates non-overlapping switch signals 624 for sequentially turning on the banks.

Figure 7:
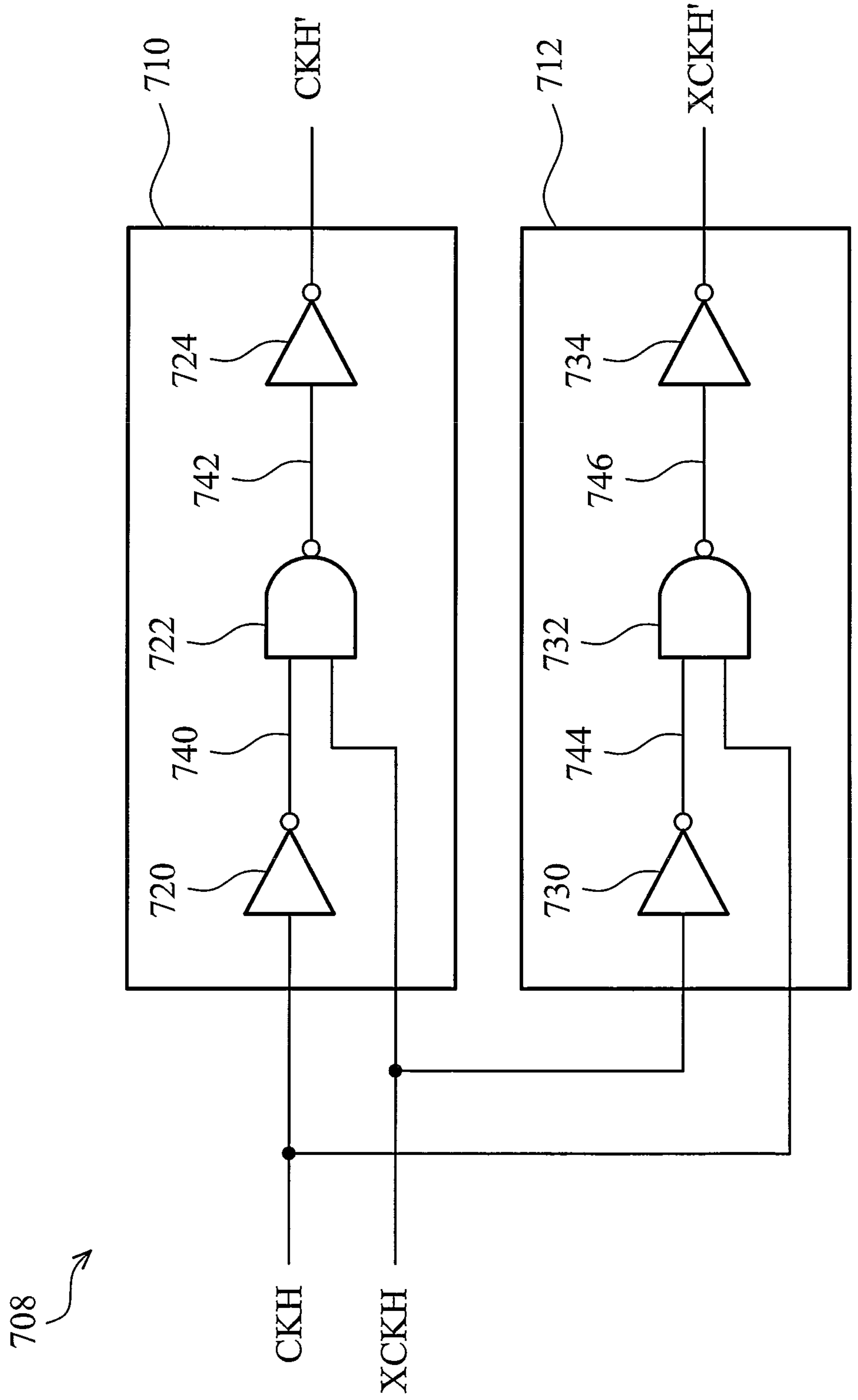
FIG. 7 illustrates a block diagram of a timing signal adjusting circuit in accordance with the invention.

FIG. 7 illustrates a block diagram of a timing signal adjusting circuit 708 in accordance with the invention. In this embodiment, the timing signal adjusting circuit 708 comprises a first NAND gate circuit 710 and a second NAND gate circuit 712 for adjusting the duty cycle of the horizontal timing signal CKH and the complementary horizontal timing signal XCKH.

Referring to FIG. 7, the first NAND gate circuit 710 comprises an odd number of serial-connected first inverters 720, a second NAND gate 722, and a third inverter 724. The first inverters 720 receive the horizontal timing signal CKH for generating an inverse signal 740 of the horizontal timing signal CKH. The second NAND gate 722 is coupled to the first inverters 720. A first terminal of the second NAND gate 722 receives the inverse signal 740 and a second terminal thereof receives the complementary horizontal timing signal XCKH for generating a first output signal 742. The third inverter 724 is coupled to the second NAND gate 722 for receiving the first output signal 742 so as to generate an updated horizontal timing signal CKH'.

Furthermore, the second NAND gate circuit 712 comprises an odd number of serial-connected fourth inverters 730, a fifth NAND gate 732, and a sixth inverter 734. The fourth inverters 730 receive the complementary horizontal timing signal XCKH for generating an inverse signal 744 of the horizontal timing signal CKH. The fifth NAND gate 732 is coupled to the fourth inverters 730. A first terminal of the fifth NAND gate 732 receives the inverse signal 744 and a second terminal thereof receives the horizontal timing signal CKH for generating a second output signal 746. The sixth inverter 734 is coupled to the fifth NAND gate 732 for receiving the second output signal 746 so as to generate an updated complementary horizontal timing signal XCKH'.

More specifically, the first NAND gate circuit 710 generates the updated horizontal timing signal CKH' with a duty cycle smaller than 50% by increasing the rising-edge delay of the horizontal timing signal CKH and decreasing the falling-edge delay thereof. Additionally, the second NAND gate circuit 712 generates the updated complementary horizontal timing signal XCKH' with a duty cycle smaller than 50% by increasing the rising-edge delay of the complementary horizontal timing signal XCKH and decreasing the falling-edge delay thereof. Thus, the horizontal driving circuit 606 generates the switch signal 624 according to the updated horizontal timing signal CKH' and the updated complementary horizontal timing signal XCKH', without the problem of overlapping.

Figure 8:
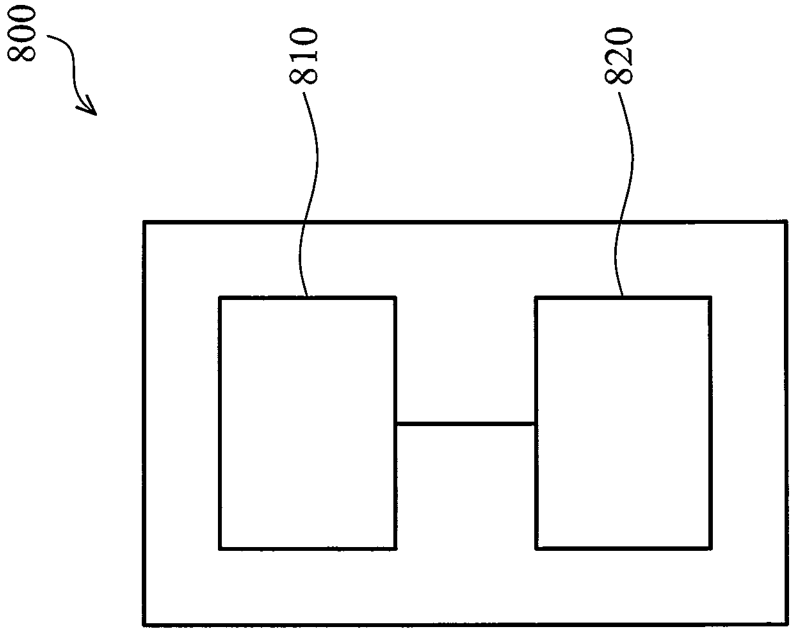
FIG. 8 illustrates a block diagram of an image display system according to another embodiment of the invention.

FIG. 8 illustrates a block diagram of an image display system 800 according to one embodiment of the invention. According to this embodiment, the image display system 800 is an electronic device. The electronic device comprises a display device 810 and a power supply device 820. For example, the display device 810 is an LCD and the power supply device 820 is coupled to the display device 810 for providing power to the display device 810 for display. For example, the electronic device may be a digital camera, personal data assistant (PDA), monitor, notebook, car display, desktop computer or mobile phone.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An image display system having a display device, wherein the display device comprises:

a timing control circuit for generating a plurality of timing signals;

a display matrix comprising a plurality of display elements arranged in a matrix and vertically divided into N banks to be sequentially updated;

a timing signal adjusting circuit coupled to the timing control circuit for adjusting the duty cycle of the timing signals; and a horizontal driving circuit coupled to the timing signal adjusting circuit for generating a plurality of switch signals according to the adjusted timing signals and sequentially turning on the banks, wherein, the switch signals are non-overlapping signals, wherein the timing signals comprise a horizontal start signal, a horizontal timing signal and a complementary horizontal timing signal, wherein the timing signal adjusting circuit comprises a first NAND gate circuit for adjusting the duty cycle of the horizontal timing signal, and the first NAND gate circuit of which comprises:

an odd number of serial-connected first inverters for receiving the horizontal timing signal to generate an inverse signal of the horizontal timing signal;

a second NAND gate coupled to the odd number of serial-connected first inverters, wherein a first terminal of the second NAND gate receives the inverse signal of the horizontal timing signal and a second terminal of the second NAND gate receives the complementary horizontal timing signal for generating a first output signal; and a third inverter coupled to the second NAND gate for receiving the first output signal to generate an updated horizontal timing signal, wherein the timing signal adjusting circuit comprises a second NAND gate circuit for adjusting the duty cycle of the complementary horizontal timing signal, and the second NAND gate circuit of which comprises:

an odd number of serial-connected fourth inverters for receiving the complementary horizontal timing signal to generate an inverse signal of the complementary horizontal timing signal;

a fifth NAND gate coupled to the odd number of serial-connected fourth inverters, wherein a first terminal of the fifth NAND gate receives the inverse signal of the complementary horizontal timing signal and a second terminal of the fifth NAND gate receives the horizontal timing signal for generating a second output signal; and a sixth inverter coupled to the fifth NAND gate for receiving the second output signal to generate an updated complementary horizontal timing signal.

2. The image display system as claimed in claim 1, further comprising: a vertical driving circuit coupled to the display matrix, comprising a plurality of vertical scanning signals for vertically scanning the display matrix to turn on the display elements.

3. The image display system as claimed in claim 1, wherein the first NAND gate circuit and the second NAND gate circuit respectively increase the rising-edge delay of the horizontal timing signal and the complementary horizontal timing signal and respectively decrease the falling-edge delay of the horizontal timing signal and the complementary horizontal timing signal.

4. The image display system as claimed in claim 1, wherein the horizontal start signal activates the generation of the switch signals.

5. The image display system as claimed in claim 1, wherein each bank comprises the same number of display elements.

6. The image display system as claimed in claim 1, wherein each display element comprises a liquid crystal display element.

7. The image display system as claimed in claim 1, further comprising: a power supply device coupled to the display device for supplying power to the display device.

8. The image display system as claimed in claim 7, wherein the image display system is an electronic device.

9. The image display system as claimed in claim 8, wherein the electronic device is a digital camera, personal data assistant, monitor, notebook, car display, desktop computer or mobile phone.

* * * * *